US012656674B2

(12) United States Patent
    Raschke et al.

(10) Patent No.:   US 12,656,674 B2
(45) Date of Patent:      Jun. 16, 2026

(54) RETICLE CONTAINER WITH DIRECTED PURGE FLOW

(71) Applicant: ENTEGRIS, INC., Billerica, MA (US)

(72) Inventors: Russ V. Raschke, Chanhassen, MN (US); Brian Wiseman, Glencoe, MN (US)

(73) Assignee: Entegris, Inc., Billerica, MA (US)

( * ) Notice:    Subject to any disclaimer, the term of this patent is extended or adjusted under 35 U.S.C. 154(b) by 168 days.

(21) Appl. No.: 18/386,869

(22) Filed:      Nov. 3, 2023

(65)            Prior Publication Data

US 2024/0160098 A1      May 16, 2024

Related U.S. Application Data

(60) Provisional application No. 63/424,388, filed on Nov. 10, 2022.

(51) Int. Cl.
    *G03F 1/66*            (2012.01)
(52) U.S. Cl.
    CPC ..................................... *G03F 1/66* (2013.01)
(58) Field of Classification Search
    CPC . G03F 1/66; G03F 7/70741; H01L 21/67353; H01L 21/67376; H01L 21/67386; H01L 21/67393; H01L 21/67359
    See application file for complete search history.

(56)            References Cited

U.S. PATENT DOCUMENTS

| | | | | |
|---|---|---|---|---|
| 2012/0037522 A1* | 2/2012 | Chiu | ................. | H01L 21/67359 |
| | | | | 206/316.1 |
| 2014/0116920 A1 | 5/2014 | Lee et al. | | |
| 2014/0291198 A1* | 10/2014 | Lu | .................... | H01L 21/67359 |
| | | | | 206/710 |
| 2021/0323756 A1* | 10/2021 | Chiu | .................... | B65D 81/18 |

FOREIGN PATENT DOCUMENTS

| | | | |
|---|---|---|---|
| CN | 107600687 A | | 1/2018 |
| CN | 108121173 A | | 6/2018 |
| JP | 2009227305 A | * | 10/2009 |
| JP | 2012238649 A | | 12/2012 |
| KR | 20160015287 A | | 2/2016 |
| TW | 200817252 A | | 4/2008 |
| TW | 200904556 A | | 2/2009 |
| TW | 201126581 A | | 8/2011 |
| WO | 2022106071 A1 | | 5/2022 |

OTHER PUBLICATIONS

Machine translation of JP-2009227305-A (Year: 2009).*

* cited by examiner

*Primary Examiner* — Steven H Whitesell

(57)            ABSTRACT

A reticle container includes an outer pod and an inner pod, the inner pod configured to contain a reticle. The outer pod includes a pod door including a purge port, and a pod dome including one or more channels configured to receive a purge gas from the purge port and direct the purge gas to particular locations within the outer pod. The channels can direct the purge gas to one or more filters of the inner pod. The channels can direct the purge gas such that there is a pressure differential between the pressure at a first filter and the pressure at the second filter. The inner pod can include deflectors or channels to further direct the purge flow through the inner pod to purge the area surrounding the reticle.

20 Claims, 9 Drawing Sheets

RETICLE CONTAINER WITH DIRECTED PURGE FLOW

FIELD

This disclosure is directed to reticle containers including ports and channels to provide directed flow, for example to provide purge function to the reticle container.

BACKGROUND

Reticle containers typically include a pod-within-a-pod construction where the reticle is contained in an inner pod, with an outer pod surrounding the inner pod. This construction can obstruct or restrict flow of purge gas over the reticle, which can slow purging of the reticle container.

SUMMARY

This disclosure is directed to reticle containers including ports and channels to provide directed flow, for example to provide purge function to the reticle container.

Reticles can be adversely affected by the presence of contaminants, for example causing oxidation or other issues. The contaminants can be gaseous contaminants. The contaminants can include, for example, water in the form of humidity, volatile organic compounds, and the like. Reticles can suffer prolonged exposure to such contaminants when contained within reticle pods, due to sealing of the pods or other restriction of flow into or out of the pods. The reticles can be purged to drive out these contaminants by supplying a purge gas to the reticle pod. In embodiments, the purge gas can further be directed to improve the effectiveness in driving contaminants out of the reticle pod.

By using channels to direct purge gas flows from ports in the pod door to the filters of an inner pod, the purge flow through the inner pod, and thus the ability to purge the environment surrounding the reticle to remove potential contaminants can be improved. Further, by using the channels to create differential pressures and optionally providing flow direction features within the inner pod, the flow can be directed into and through the inner pod to provide further improvement to purge effectiveness.

In an embodiment, a reticle pod includes an inner pod including a cover and a baseplate. At least one filter is provided on the cover or the baseplate. The inner pod is configured to accommodate a reticle. The reticle pod also includes an outer pod configured to accommodate the inner pod. The outer pod includes a pod door, the pod door including one or more purge inlets, and a pod dome. At least one of the pod door and the pod dome include one or more channels each configured to direct flow from one of said at least one purge inlet to one of said at least one filter.

In an embodiment, the channel is a closed duct.

In an embodiment, the inner pod includes a plurality of said filters. In an embodiment, the one or more channels are configured to direct flow such that a first pressure at a first filter of the plurality of filters is greater than a second pressure at a second filter of the plurality of filters. In an embodiment, the inner pod includes one or more deflectors positioned on an inner surface of the inner pod. In an embodiment, the one or more deflectors are positioned between the first filter and the second filter.

In an embodiment, the one or more channels are formed in the pod dome. In an embodiment, the pod dome includes a pod dome shell and one or more inserts joined to the pod dome shell, the one or more channels defined by the pod dome shell and the one or more inserts. In an embodiment, the inserts are mechanically joined to the pod dome shell. In an embodiment, the pod dome includes a purge inlet interface for each of the one or more purge inlets included in the pod door, the purge inlet interface configured to direct flow from one of the purge inlets to at least one of the one or more channels. In an embodiment, each purge inlet interface includes a seal configured to contact the pod door surrounding the one of the purge inlets. In an embodiment, each purge inlet interface is spaced apart from a surface of the pod door surrounding the one of the purge inlets when the pod dome is joined to the pod door. In an embodiment, each purge inlet interface is configured to define a tortuous path between the one of the purge inlets and an internal space of the outer pod outside of the channels.

In an embodiment, the one or more channels are provided on the pod door. In an embodiment, the one or more channels are at least partially defined by an insert attached to the pod door.

In an embodiment, a method of purging a reticle pod includes providing a purge gas at one or more purge inlets provided on an outer pod and directing the purge gas from the one or more purge inlets to at least one filter provided on an inner pod by way of one or more channels formed in the outer pod. The purge gas enters the inner pod at the at least one filter.

In an embodiment, the one or more channels are closed ducts.

In an embodiment, the inner pod includes a plurality of filters, and the purge gas is directed to the at least one filter such that a first pressure at a first filter of the plurality of filters is greater than a second pressure at a second filter of the plurality of filters. In an embodiment, the method further includes deflecting flow of the purge gas inside the inner pod using at least one deflector provided on an inner surface of the inner pod.

In an embodiment, the method further includes directing flow from the one or more purge inlets to the one or more channels using one or more purge inlet interfaces. In an embodiment, the purge inlet interfaces each form a seal surrounding one of the one or more purge inlets. In an embodiment, each of the purge inlet interfaces are spaced apart from a surface of the pod door surrounding a corresponding one of the purge inlets when the pod dome is joined to the pod door.

In an embodiment, the one or more channels are formed in a pod dome of the outer pod. In an embodiment, the one or more channels are formed in a pod door of the outer pod.

In an embodiment, a method includes purging an inner pod of a dual pod reticle container by directing purge gas from one or more inlets on the outer pod inlets to at least one filter provided on an inner pod by way of one or more channels formed in the outer pod.

DRAWINGS

DETAILED DESCRIPTION

This disclosure is directed to reticle containers including ports and channels to provide directed flow, for example to provide purge function to the reticle container.

As used herein, "channel" refers to any guided flow path that can direct purge gas in a reticle pod. The channel can include, for example, grooves or recesses through which the purge gas can flow, deflectors configured to guide a flow, a closed duct as defined below, combinations thereof, and the like. The channel can include multiple features to direct the purge gas through the guided flow path, for example a groove or recess that directs the flow to an inlet of a closed duct or a closed duct where the ending point directs flow at a flow deflector or into a groove or recess.

As used herein, "closed duct" refers to a channel where the channel is a passage surrounded on all sides from a starting point such as an intake to an ending point such as a purge distributor. In an embodiment, a closed duct may be used to provide some or all of a channel. The starting point and the ending point of a closed duct as defined herein can optionally be sealed when connecting to other features such as a purge inlet port or a part of the reticle pod receiving the purge flow, but such sealing is not required for an enclosed passage to be considered a closed duct. When a closed duct is sealed at one or both of the starting point and the ending point, a higher pressure of the purge gas can be achieved within the closed duct.

Figure 1:
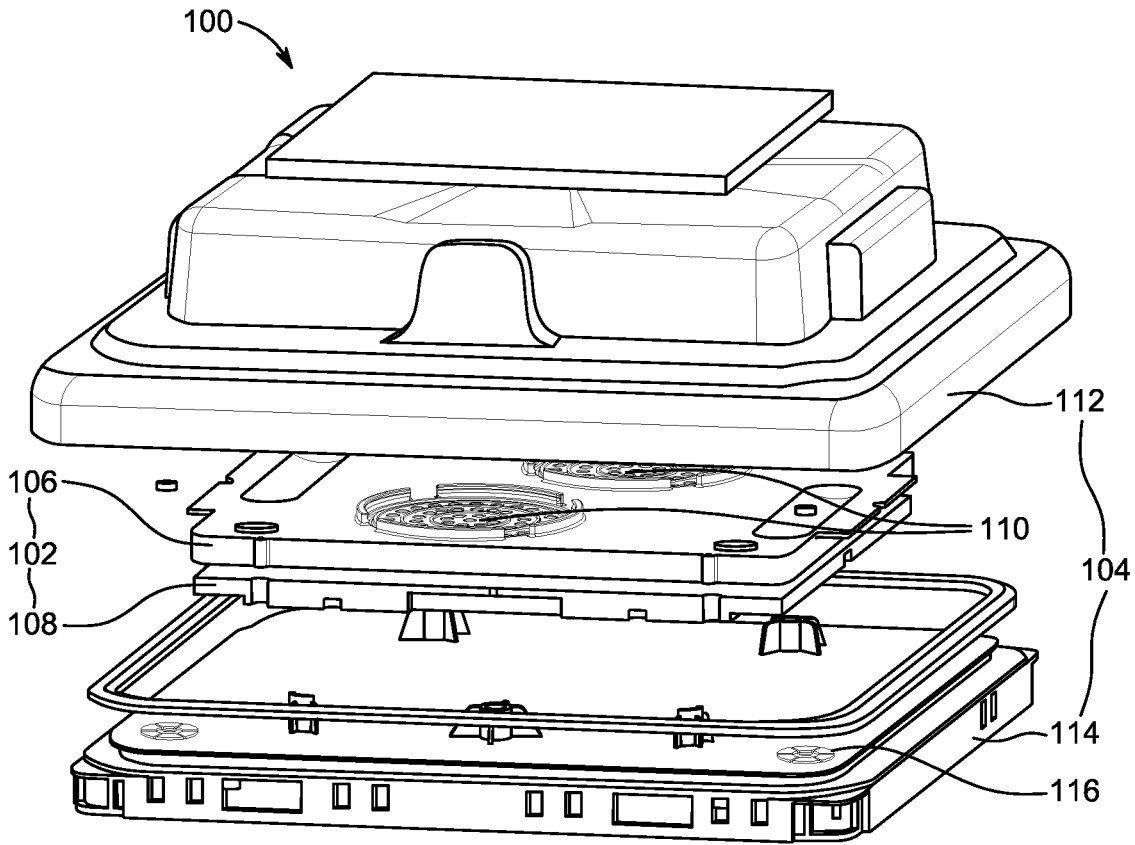
FIG. 1 shows an exploded view of a reticle container according to an embodiment.

FIG. 1 shows an exploded view of a reticle container according to an embodiment. Reticle container 100 includes inner pod 102 and outer pod 104. Inner pod 102 includes cover 106 and baseplate 108. One or more filters 110 are provided on inner pod 102. The outer pod 104 includes pod dome 112 and pod door 114. Pod door 114 includes one or more purge ports 116.

Reticle container 100 is configured to accommodate a reticle. Reticle container 100 can be, for example, a pod for a photolithography reticle, for example for use with reticles being processed by extreme ultraviolet (EUV) photolithography. Reticle container 100 can be used for the transportation and storage of reticles.

Inner pod 102 is configured to contain the reticle. Inner pod 102 includes cover 106 and baseplate 108. Filters 110 are provided on the inner pod 102. Filters 110 can be positioned on either or both of cover 106 and baseplate 108. In the embodiment shown in FIG. 1, two filters 110 are provided on the cover 106. The filters 110 can allow the passage of gas into or out of the internal space of inner pod 102 where reticle can be contained. In an embodiment, at least one of filters 110 can be used to allow purge to enter the internal space of inner pod 102, and another at least one of filters 110 can be used to allow purge to exit the internal space of inner pod 102. The passage of gas into or out of the internal space of inner pod 102 through filters 110 can occur based on relative pressures of gas at each of the filters 110. In an embodiment, inner pod 102 can include one or more features to direct flow inside of the inner pod 102, for example recesses or grooves formed in one or both of cover 106 and baseplate 108, flow deflectors positioned on an internal surface of one or both of cover 106 and baseplate 108 between at least two filters 110, combinations thereof, and the like.

Outer pod 104 is configured to accommodate the inner pod 102. Outer pod 104 includes pod dome 112 and pod door 114. The pod dome 112 and pod door 114 can be latched together so as to fix pod door 114 to pod dome 112.

Pod dome 112 is configured to define an internal space capable of accommodating inner pod 102 when the reticle is contained within the inner pod 102. Pod dome 112 can define one or more channels configured to direct flows of gas such as purge gas within the internal space of outer pod 104. The channels can be any suitable shape for directing flows of purge gas through the internal space of the outer pod 104, for example, closed ducts or open grooves or recesses in the internal surface of the pod dome 112. Closed ducts are defined as passages that are completely surrounded by a wall. Closed ducts can be configured to allow a pressure within the closed duct to exceed a pressure within at least portions of the internal space of outer pod 104. The channels can be positioned to provide a channel intake configured to interface with purge ports 116. In an embodiment, the interface of the channel with a purge port 116 includes placing a channel intake in proximity to the purge port 116. In an embodiment, the interface of the channel with a purge port 116 includes a seal. In an embodiment, the interface of the channel with a purge port 116 includes corresponding features defining a tortuous path, such that flow from the purge port 116 enters the channel as opposed to passing into the internal space of outer pod 104. The channels can be configured to direct flow of gas from purge ports 116 along a desired flow path or to a desired location for delivery of the gas from purge ports 116. In an embodiment, the desired location for delivery of gas from the purge ports 116 is at one or more of the filters 110. In an embodiment, the channels included in pod dome 112 can direct the gas from purge ports 116 to at least one but not all of the filters 110 provided on the inner pod 102.

Pod door 114 is configured to be joined to pod dome 112 at an opening, so as to enclose the outer pod 104. Pod door 114 can include a latching mechanism configured to secure the pod door 114 to pod dome 112. Pod door 114 can include one or more purge ports 116. Purge ports 116 are ports extending through the pod door 114 such that gas, such as a purge gas, can be introduced into the internal space of the outer pod 104. The purge ports 116 can include any suitable filters or flow controls such as valves, for example an umbrella valve. Purge ports 116 can each include an interface allowing connection to a purge source, such as a purge line of a load port or a storage unit where the reticle container 100 may be present. Purge ports 116 are configured to convey gas from the interface with the purge source to an opening on an interior side of the pod door 114. The pod door 114 can optionally include interface features surrounding the opening on the interior side of the pod door 114, for example to direct flow into channels provided in pod dome 112 or restrict flow to the internal space of the outer pod 104, for example by at least partially defining a tortuous path such that flow through the purge port 116 primarily enters one or more of the channels provided in pod dome 112.

Figure 2:
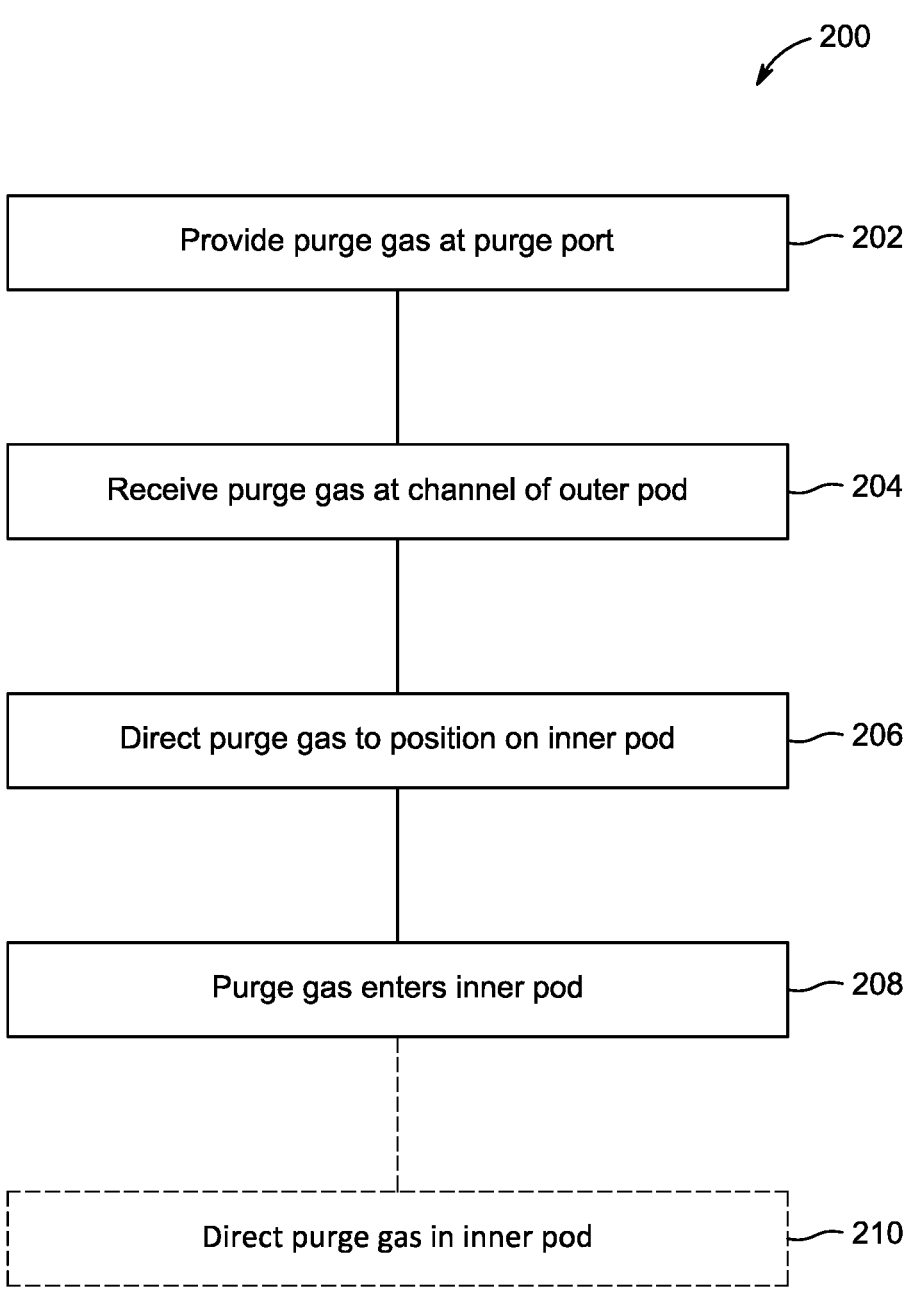
FIG. 2 shows a method of purging a reticle container according to an embodiment.

FIG. 2 shows a method of purging a reticle container according to an embodiment. Method 200 includes providing a purge gas at a purge port of an outer pod at 202, receiving the purge gas at one or more channels formed in a pod dome at 204, directing the purge gas to a position on an inner pod at 206, and the purge gas entering the inner pod at 208. Optionally, the method can further include directing flow of the purge gas inside the inner pod at 210.

A purge gas is provided at 202. The purge gas can be any suitable purge gas for introduction into the reticle container, such as, as non-limiting examples, nitrogen, clean dry air (CDA), extra-clean dry air (xCDA), inert gases, combinations thereof, and the like. The purge gas can be provided to the reticle container at one or more purge ports provided on the reticle container, such as purge ports 116 provided on pod door 114 of reticle container 100 shown in FIG. 1 and described above. It is understood that purge ports can alternatively be provided on pod dome 112 or any other suitable point on an exterior of the reticle container so as to be introduced into the interior of the reticle container. The purge gas can be provided at the one or more purge ports at 202 by any suitable piping or connection to the purge port, such as a purge line and connector provided in a photolithography tool, a load port, a storage area, or the like.

The purge gas is received at one or more channels at 204. The channels can be defined by a pod dome such as pod dome 112 described above and shown in FIG. 1, or an insert provided with the pod dome. The channels can include one end located at or near the purge ports where purge gas is received at 202. In an embodiment, the end of the channel at or near the purge ports forms a seal with a corresponding purge port. In an embodiment, the end of the channel at or near the purge ports is in close proximity to the purge port such that a majority of flow through the purge port enters the channel. In an embodiment, the end of the channel and the purge port are configured such that a tortuous path is defined to obstruct flow from the purge port into an interior of the reticle container without passing into and through the channel.

The purge gas is directed to a position of an inner pod at 206. The purge gas can be directed at 206 by one or more channels configured to convey the purge gas to the position where the purge gas is desired to be released within the outer pod. The channels can be formed in a pod dome or an insert joined to the pod dome. The channels can be any suitable channels for directing at least a portion of the purge gas, such as closed ducts, open grooves or other such pathways, combinations thereof, and the like. The position that the purge gas is directed to can correspond to a position on or a feature of the inner pod, such as, for example, one or more filters provided on the inner pod. In an embodiment, the purge gas can be directed to at least one but not all of the filters provided on the inner pod, such that there is at least one filter where a pressure of the purge gas is relatively higher and at least one filter where the pressure of the purge gas is relatively lower.

Purge gas enters the inner pod at 208. Purge gas can enter the inner pod at 208 through one or more of the filters provided on the inner pod. In an embodiment where there is at least one filter where a pressure of the purge gas is relatively higher and at least one filter where the pressure of the purge gas is relatively lower, the purge gas can enter the inner pod at 208 at the one or more filters having the relatively higher pressure of the purge gas. The purge gas entering the inner pod at 208 and any gaseous materials such as gaseous contaminants purged by the introduction of the purge gas to the inner pod at 208, can leave the inner pod at one or more of the filters. In an embodiment where there is at least one filter where the pressure of the purge gas is relatively lower, the purge gas and any other gaseous materials can exit the inner pod at the filter having relatively lower pressure.

Optionally, the method further includes directing flow of the purge gas inside the inner pod at 210. The direction of the flow at 210 can be performed using one or more deflectors or channels provided inside the internal space of the inner pod, for example using such features formed on inner surfaces of one or both of the cover and the baseplate. The direction of the flow at 210 can be according to a desired flow path through the inner pod to provide desired purging of the internal space. The direction of the flow at 210 can include directing the purge gas from one or more high-pressure filters where purge gas enters the internal space of the inner pod, through the internal space, and ultimately to one or more low-pressure filters where the purge gas exists the internal space of the inner pod.

Figure 3:
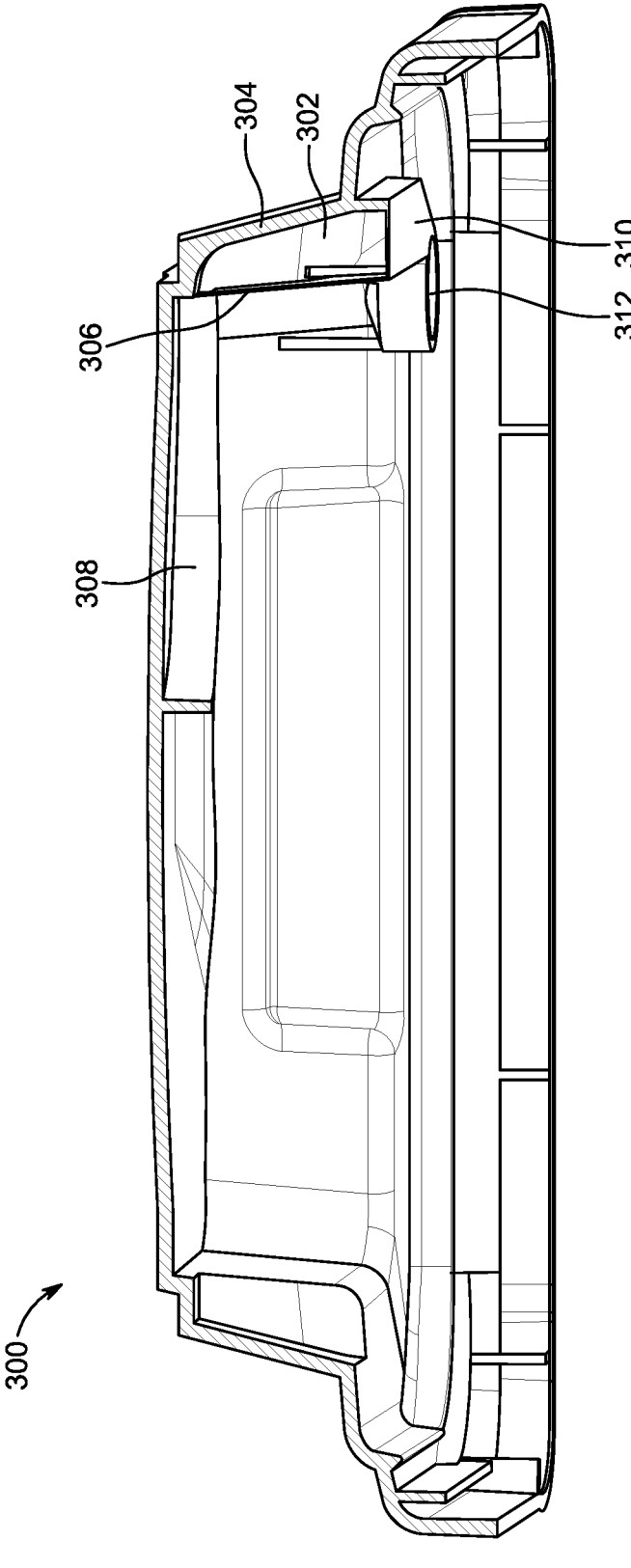
FIG. 3 shows a sectional view of a reticle container according to an embodiment.

FIG. 3 shows a sectional view of a pod dome of reticle container according to an embodiment. Pod dome 300 includes channel 302 defined by inner wall 304 and outer wall 306. Channel 302 extends to purge gas distributor 308. Purge gas distributor 308 is positioned opposite a filter (not shown) provided on a cover (not shown) of an inner pod of the reticle container. The filter can be, for example, one of the filters 110 of cover 106 as described above and shown in FIG. 1. Insert 310 can provide portions defining channel 302 such as inner wall 304.

Channel 302 extends from a channel intake such as channel intake 412 described below and shown in FIGS. 4A-4C. Channel 302 is configured to convey purge gas received at inlet 312 from a purge port such as purge port 116 described above and shown in FIG. 1 or purge port 404 described below and shown in FIGS. 4A-4C. The channel can have any suitable shape to convey the purge gas from the channel intake to the desired location for the purge flow to be provided.

In an embodiment, channel 302 is a closed duct channel including an inner wall 304 and an outer wall 306. Outer wall 306 can be formed in the pod dome 300. In an embodiment, inner wall 304 is also integrally formed in the pod dome 300. In an embodiment, inner wall 304 is a part of an insert 310, that is joined to the pod dome 300, for example by mechanical engagement such as one or more snap-fits. In an embodiment, the channel 302 can be defined only by outer wall 306, such as by features such as grooves, recesses, or the like configured to direct the flow of purge gas. In an embodiment, a channel 302 omitting the inner wall 304 can instead rely on other structures such as the inner pod including the cover of an inner pod to assist in directing the flow to the desired location.

In the embodiment shown in FIG. 3, the desired location that channel 302 conveys purge gas to is the purge gas distributor 308. Purge gas distributor 308 can be configured to direct the purge gas to a desired point in the internal space defined by pod dome 300. In the embodiment shown in FIG. 3, the purge gas distributor 308 is opposite at least one filter provided on the cover. The purge gas distributor 308 can allow purge gas to exit the channel 302 in proximity to the filter, such that the purge gas can enter the inner pod by way of the filter. In an embodiment, the filter can be provided a pressure of purge gas that is higher than a pressure of purge gas elsewhere in the internal space defined by pod dome 300. The filter can be provided a pressure of purge gas that is greater than a pressure at a second filter (not shown), allowing the purge gas to enter the inner pod at filter and allowing gas including the purge gas and any other gases to exit the inner pod at said second filter.

Insert 310 can at least partially define the channels 302 provided in the pod dome 300. The insert 310 can include surfaces that enclose or otherwise define the channels. In an embodiment, the insert can be retained by way of contact with the interior of the reticle container, for example components of outer pod 104 or the exterior of the inner pod 102 as described above and shown in FIG. 1. In an embodiment, the insert 310 can be configured to be fixed to pod dome 300 through any suitable means, for example through mechanical engagement using engagement features such as corresponding snap-fit features on the insert 310 and pod dome 300, or any the like. The insert 310 can include the features of the channels configured to interface with the purge ports, for example as described below and shown in FIGS. 4A-4C. The insert 310 can include one or more discrete pieces.

Figure 4A:
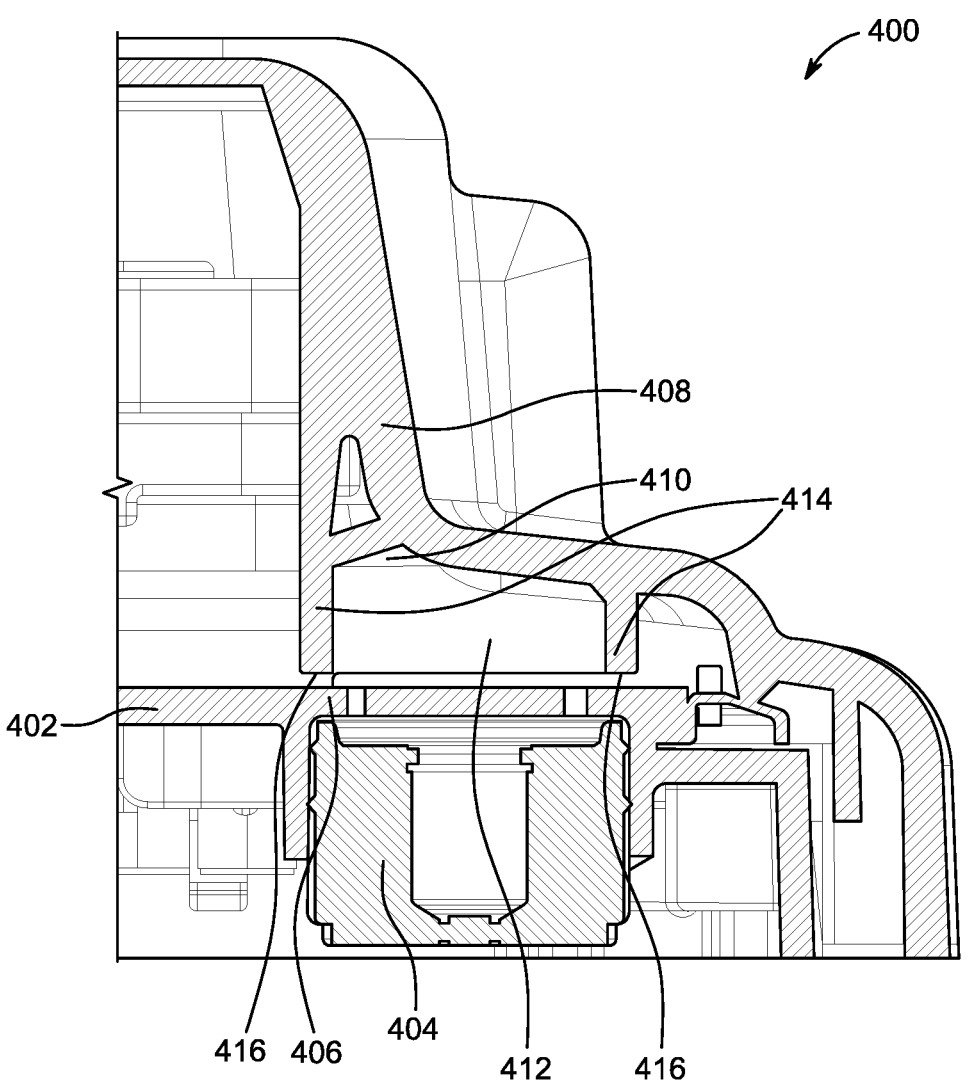
FIG. 4A shows a sectional view of a reticle container according to an embodiment.

FIG. 4A shows a sectional view of a reticle container according to an embodiment. Reticle container 400 includes pod door 402. Purge port 404 is included in pod door 402, surrounded by peripheral region 406. Pod dome 408 defines a channel 410 having a channel intake 412 positioned over the purge port 404 in close proximity, with channel intake walls 414 separated from peripheral region 406 by interface gap 416.

Reticle container 400 is a reticle pod including an outer pod defined by the pod door 402 and pod dome 408, and an inner pod (not shown) contained within the outer pod. The outer pod is configured to direct flows of purge gas to particular locations by receiving the flow of purge gas at purge port 404 and using one or more channels 410 to distribute the flow within the internal space of the outer pod.

In the embodiment shown in FIG. 4A, the channel intake walls 414 are configured to oppose the peripheral region 406 of the pod door 402 surrounding the purge port. The channel intake walls 414 can be configured to be spaced apart from peripheral region 406 such that there is not contact between intake walls 414 and peripheral region 406. The spacing apart of peripheral region 406 and intake walls 414 can form interface gap 416. Interface gap 416 can be sized such that flow through the purge port 404 primarily enters channel intake 412 and passes into channel 410 to be directed through the reticle container.

Figure 4B:
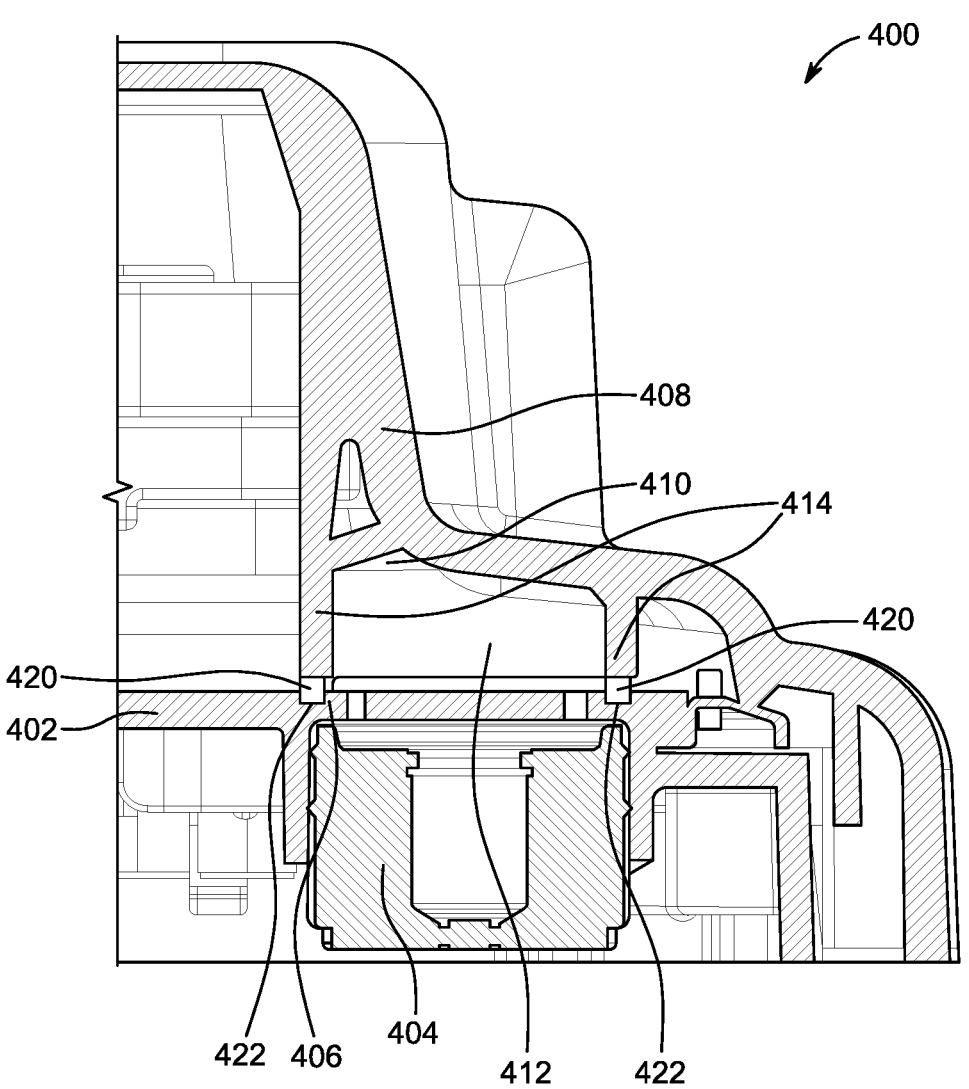
FIG. 4B shows a sectional view of a reticle container according to an embodiment.

FIG. 4B shows a sectional view of a reticle container according to an embodiment. In the embodiment shown in FIG. 4B, a seal 420 is provided in one or both of peripheral region 406 and at an end of the channel intake walls 414 so as to seal the junction between the purge port 404 and the channel intake 412. The seal 420 can be made of one or more pieces of resilient material configured to be compressed when the pod dome and pod door are joined to form the outer pod of the reticle container. Any suitable resilient material capable of forming a seal when compressed between peripheral region 406 and channel intake walls 414 can be used. The material for the seal 420 can be selected to limit or eliminate off-gassing, limit particle generation, and the like such that seal 420 does not substantially contribute to potential contamination of the reticle. Non-limiting examples of materials for seal 420 can include polyolefins, fluoroelastomers, or the like. Further non-limiting examples of materials for seal 420 can include Viton™ or polybutyl terephthalate (PBT). In an embodiment, seal 420 can include one or more portions positioned in one or more recesses 422 formed in one or both of peripheral region 406 and the end of channel intake walls 414. In an embodiment, seal 420 can fit over the end of channel intake walls. In an embodiment, seal 420 or portions thereof can be mechanically joined to one or both of peripheral region 406 and channel intake walls by any suitable mechanical connection, for example using press-fit projections and corresponding recesses, snap-fit engagement features, or the like. The seal can limit or prevent flow such that flow through the purge port 404 primarily or entirely enters channel intake 412 and passes into channel 410 to be directed through the reticle container.

Figure 4C:
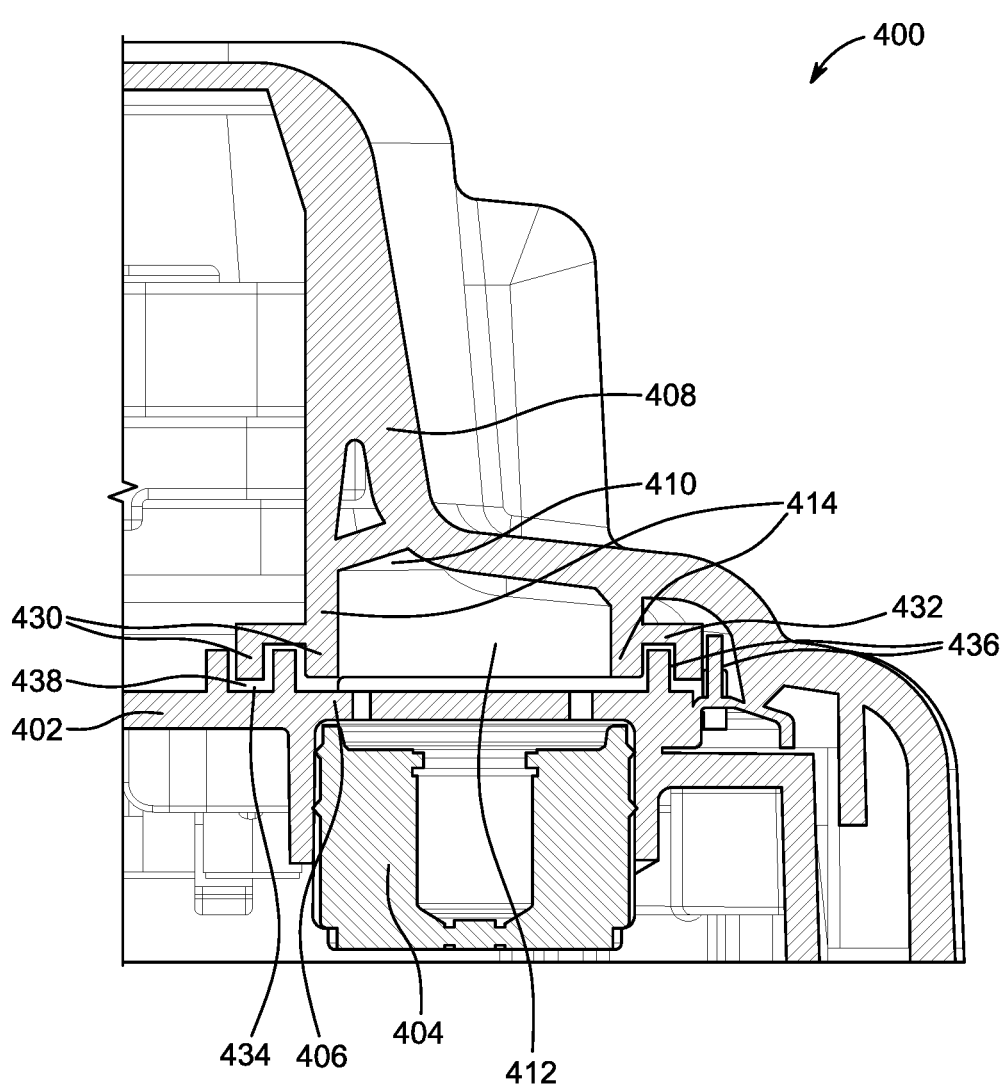
FIG. 4C shows a sectional view of a reticle container according to an embodiment.

FIG. 4C shows a sectional view of a reticle container according to an embodiment. In the embodiment shown in FIG. 4C, channel intake walls 414 include intake-side projections 430 and intake-side recess 432, with corresponding port-side recesses 434 and port-side projections 436 provided in the peripheral region 406. When the outer pod including pod door 402 and pod dome 408 is assembled, the intake-side projections 430 oppose the port-side recesses 434 and the intake-side recesses 432 oppose the port-side projections 436. The respective projections and corresponding recesses 430, 432, 434, 436 can define a tortuous path where a gap 438 is provided, with a plurality of bends in the tortuous path. The gap 438 can vary in width along the tortuous path. The bends can be areas where flow through the tortuous path must change direction as it flows from the junction of purge port 404 and channel intake 412 towards an interior space of the outer pod defined by the pod door 402 and pod dome 408. The tortuous path can restrict flow such that flow through the purge port 404 primarily enters channel intake 412 and passes into channel 410 to be directed through the reticle container.

Figure 5:
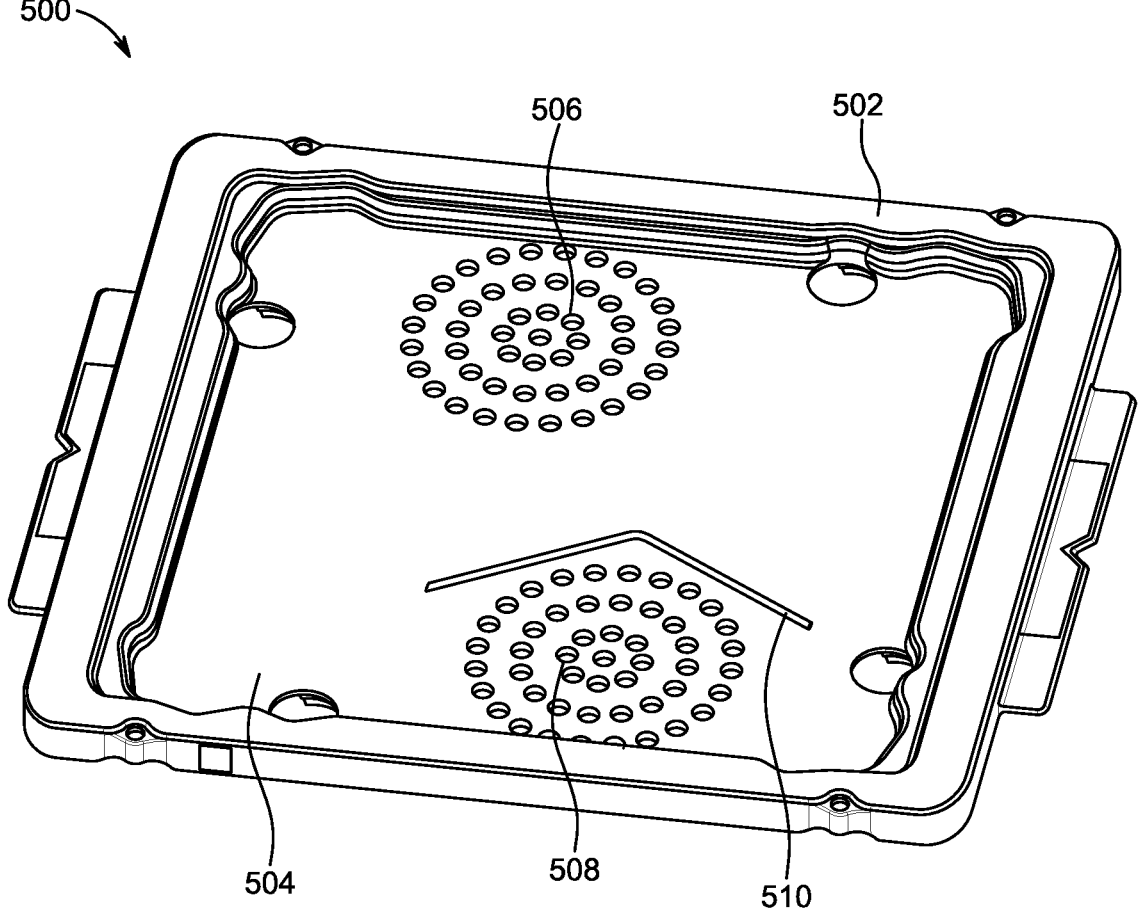
FIG. 5 shows a cover of an inner pod according to an embodiment.

FIG. 5 shows a cover of an inner pod according to an embodiment. Cover 500 is a cover of the inner pod, such as inner pod 102 described above and shown in FIG. 1. Cover 500 includes sealing region 502 and reticle accommodation region 504. A first one or more filter openings 506 can be provided in the reticle accommodation region 504. In an embodiment, a second one or more filter openings 508 can also be provided in the reticle accommodation region 504. Optionally, deflectors 510 can also be included in the reticle accommodation region 504.

The sealing region 502 is a region configured to be in proximity to or contact with a corresponding sealing region provided on a baseplate included in the inner pod including cover 500. The sealing region surrounds and defines the reticle accommodation region 504. The reticle accommodation region is a portion of cover 500 configured to accommodate at least a part of a reticle such that the reticle can be contained within the inner pod formed by joining cover 500 to a corresponding baseplate.

A first one or more filter openings 506 are provided in the reticle accommodation region 504. The first one or more filter openings 506 are openings configured to allow passage of gas into or out of the internal space of the inner pod including cover 500. In an embodiment, the first one or more filter openings 506 are all associated with a particular filter provided in the cover 500. In an embodiment, the first one or more filter openings 506 are associated with a first filter at which a pressure of purge gas is greater than at a second filter, such that the purge gas enters the inner pod through the first one or more filter openings.

A second one or more filter openings 508 can be provided in the reticle accommodation region 504 in some embodiments. The second one or more filter openings 508 are openings configured to allow passage of gas into or out of the internal space of the inner pod including cover 500. In an embodiment, the second one or more filter openings 508 are all associated with a second particular filter provided in the cover 500, separate from the filter that the first one or more filter openings 506 are associated with. The second particular filter can be a filter where a pressure of the purge gas is relatively lower than the pressure of the purge gas at the first filter, such that purge gas exits the inner pod including cover 500 at the second one or more filter openings 508.

In an embodiment, one or more deflectors 510 can be provided on cover 500 within the reticle accommodation region 504. The one or more deflectors can be projections such as ridges, flanges, blocks, ramped surfaces, curved surfaces, or the like extending outwards from reticle accommodation region 505. The deflectors 510 are configured so as to direct flow of purge gas within the inner pod including cover 500. The configuration of the deflectors 510, including the size, shape, positioning, and the like can be selected to achieve a desired flow of purge gas through the inner pod. In an embodiment, deflectors 510 are configured to prevent flow from passing directly from a first one or more filter openings 506 at a filter where a relatively higher-pressure purge gas is present to a second one or more filter openings 508 at a filter having relatively lower pressure of the purge gas. In an embodiment, the deflectors 510 can be configured to provide flow of the purge gas to other parts of the internal space of the inner pod including the cover 500. In an embodiment, the deflectors 510 can direct flow to channels of a baseplate such as channels 608 described below and shown in FIG. 6.

Figure 6:
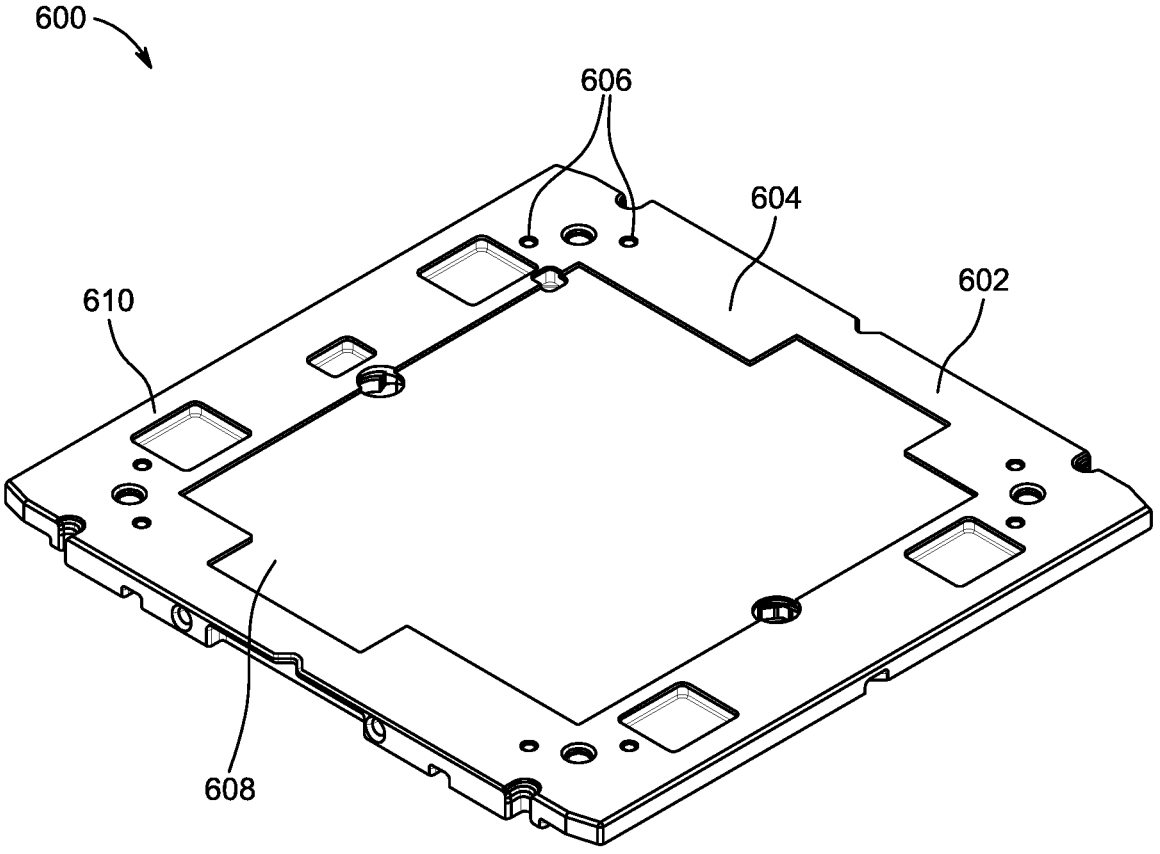
FIG. 6 shows a baseplate of an inner pod according to an embodiment.

FIG. 6 shows a baseplate of an inner pod according to an embodiment. Baseplate 600 is a baseplate of the inner pod, such as inner pod 102 described above and shown in FIG. 1. Baseplate 600 includes a sealing region 602 and a reticle accommodation region 604. Reticle accommodation region 604 includes a plurality of reticle supports 606. Recesses or channels 608 are provided in one or both of sealing region 602 and reticle accommodation region 604 to allow flow around and underneath a reticle when the reticle is in the reticle accommodation region.

Sealing region 602 surrounds the reticle accommodation region 604. The sealing region 602 can include a sealing surface 610. Sealing surface 610 is configured to contact or be in proximity with an opposing sealing surface of a cover, such as cover 500 described above and shown in FIG. 5, so as to define the reticle accommodation space.

The reticle accommodation region 604 is a region configured to accommodate at least a portion of a reticle when the reticle container including baseplate 600 is assembled. The reticle accommodation region 604 includes a plurality of reticle supports 606 configured to support the reticle and retain the reticle in position when the reticle container including baseplate 600 is assembled.

Recess or channels 608 can be provided in one or both of the sealing region 602 and the reticle accommodation region 604. The recess or channels can be, for example, recessed regions, grooves, notches, trenches, ducts, or the like formed in one or both of sealing region 602 and reticle accommodation region 604. The recess or channels can be provided in any suitable configuration to facilitate the flow of purge gas under the reticle when the inner pod including baseplate 600 is assembled containing a reticle and purge flow is provided to the inner pod, for example through one or more filters included in a cover mated to the baseplate 600. The recess or channels 608 can provide areas where purge flow can pass around and underneath a reticle when the reticle is resting on reticle supports 606. The configuration of the recess or channels 608, including, for example, the direction, depth, shape, etc. of the recess or channels 608 can be any suitable configuration to facilitate a desired flow of purge gas beneath a reticle.

Figure 7:
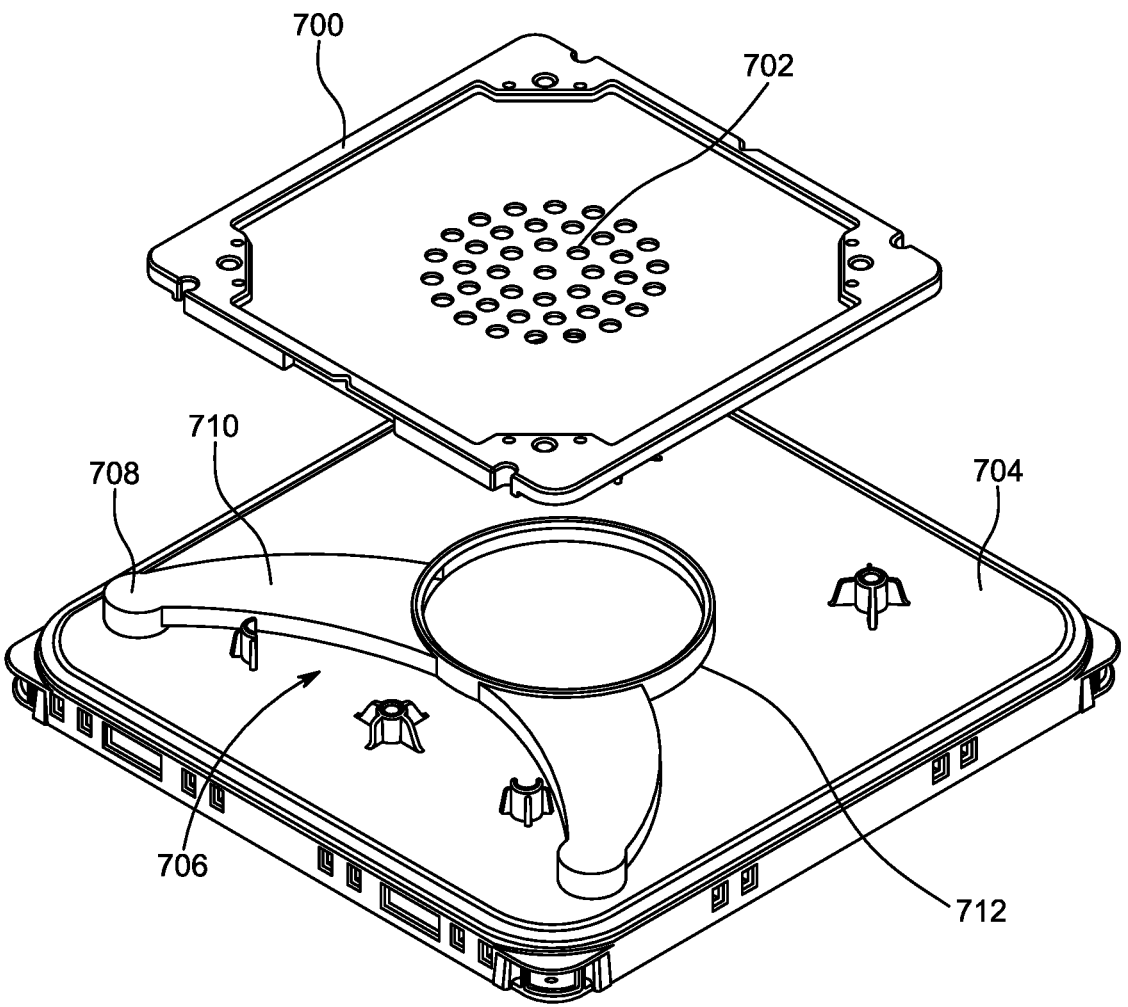
FIG. 7 shows a baseplate of an inner pod and a door of an outer pod according to an embodiment.

FIG. 7 shows a baseplate of an inner pod and a pod door of an outer pod according to an embodiment. Baseplate 700 includes filter openings 702 formed therein, such that gas can enter into or exit out of the inner pod including baseplate 700. The filter openings can have any suitable size and position for allowing the gas to enter or exit the inner pod. The filter openings can be positioned within a reticle accommodation region of the baseplate 700.

Pod door 704 includes purge gas director 706. Purge gas director 706 includes purge inlet interface 708, channel 710, and purge gas distributor 712. The purge gas director 706 can be formed integrally with pod door 704, provided as a module attached to pod door 704, or can include features formed in pod door 704 and one or more inserts attached to pod door 704 to define the features of the purge gas director 706 or portions thereof. The attachment of a module or inserts providing purge gas director 706 can be mechanical attachments such as snap fits, slot and tab combinations, or the like, adhesives, which can be selected at least in part based on outgassing characteristics, or the like.

The purge gas director 706 includes a purge inlet interface 708. In an embodiment, the purge inlet interface 708 is integral with purge ports provided in the pod door 704, such as the purge ports 116 described above and shown in FIG. 1. In an embodiment, the purge inlet interface 708 can interface with the purge port through any suitable interface, such as the interfaces shown in FIGS. 4A-4C and described above. The purge inlet interface 708 is configured to receive the purge gas from purge ports provided in the pod door, and to direct the received purge gas into channels 710.

The channels 710 are guided flow paths configured to direct the purge gas from the purge inlet interface 708 to the purge gas distributor 712. In the embodiment shown in FIG. 7, the channels 710 are closed ducts, which are passages surrounded on all sides as they extend from the purge inlet interface 708 as a starting point to the purge gas distributor 712 as an ending point. The channels 710 can alternately be recesses, grooves, one or more deflectors, combinations thereof, and the like. The channels 710 provide the flow of purge gas from purge inlet interface 708 to the purge gas distributor 712.

Purge gas distributor 712 is configured to direct purge gas into the filter openings 702 on baseplate 700. The purge gas distributor 712 can include one or more openings positioned to oppose the filter openings 702. Purge gas distributor 712 can include one or more walls or deflectors configured to reduce or prevent flow of purge gas into an interior of the outer pod without passing into the filter openings 702. The purge gas distributor can interface with the filter openings 702 or surrounding features on baseplate 700 so as to form a seal or otherwise allow for generation of a pressure differential between the purge gas within the purge gas distributor 712 and the interior of the outer pod.

Aspects:

It is understood that any of aspects 1-13 can be combined with any of aspects 14-20.

Aspect 1. A reticle pod, comprising:

an inner pod including a cover and a baseplate, wherein at least one filter is provided on the cover or the baseplate, the inner pod configured to accommodate a reticle; and an outer pod configured to accommodate the inner pod, the outer pod including:

a pod door, the pod door including one or more purge inlets, and a pod dome, wherein at least one of the pod door and the pod dome including one or more channels each configured to direct flow from one of said at least one purge inlet to one of said at least one filter.

Aspect 2. The reticle pod according to aspect 1, wherein the channel is a closed duct.

Aspect 3. The reticle pod according to any of aspects 1-2, wherein the inner pod includes a plurality of said filters.

Aspect 4. The reticle pod according to aspect 3, wherein the one or more channels are configured to direct flow such that a first pressure at a first filter of the plurality of filters is greater than a second pressure at a second filter of the plurality of filters.

Aspect 5. The reticle pod according to aspect 4, wherein the inner pod includes one or more deflectors positioned on an inner surface of the inner pod.

Aspect 6. The reticle pod according to aspect 5, wherein the one or more deflectors are positioned between the first filter and the second filter.

Aspect 7. The reticle pod according to any of aspects 1-6, wherein the one or more channels are formed in the pod dome.

Aspect 8. The reticle pod according to aspect 7, wherein the pod dome includes a pod dome shell and one or more inserts joined to the pod dome shell, the one or more channels defined by the pod dome shell and the one or more inserts.

Aspect 9. The reticle pod according to aspect 8, wherein the inserts are mechanically joined to the pod dome shell.

Aspect 10. The reticle pod according to any of aspects 7-9, wherein the pod dome includes a purge inlet interface for each of the one or more purge inlets included in the pod door, the purge inlet interface configured to direct flow from one of the purge inlets to at least one of the one or more channels.

Aspect 11. The reticle pod according to aspect 10, wherein each purge inlet interface includes a seal configured to contact the pod door surrounding the one of the purge inlets.

Aspect 12. The reticle pod according to any of aspects 10-11, wherein each purge inlet interface is spaced apart from a surface of the pod door surrounding the one of the purge inlets when the pod dome is joined to the pod door.

Aspect 13. The reticle pod according to any of aspects 10-12, wherein each purge inlet interface is configured to define a tortuous path between the one of the purge inlets and an internal space of the outer pod outside of the channels.

Aspect 14. The reticle pod according to any of aspects 1-13, wherein the one or more channels are provided on the pod door.

Aspect 15. The reticle pod according to aspect 14, wherein the one or more channels are at least partially defined by an insert attached to the pod door.

Aspect 16. A method of purging a reticle pod, comprising:
providing a purge gas at one or more purge inlets provided on an outer pod; and
directing the purge gas from the one or more purge inlets to at least one filter provided on an inner pod by way of one or more channels formed in the outer pod, wherein the purge gas enters the inner pod at the at least one filter.

Aspect 17. The method according to aspect 16, wherein the one or more channels are closed ducts.

Aspect 18. The method according to any of aspects 16-17, wherein the inner pod includes a plurality of filters, and the purge gas is directed to the at least one filter such that a first pressure at a first filter of the plurality of filters is greater than a second pressure at a second filter of the plurality of filters.

Aspect 19. The method according to aspect 18, further comprising deflecting flow of the purge gas inside the inner pod using at least one deflector provided on an inner surface of the inner pod.

Aspect 20. The method according to any of aspects 16-19, further comprising directing flow from the one or more purge inlets to the one or more channels using one or more purge inlet interfaces.

Aspect 21. The method according to aspect 20, wherein the purge inlet interfaces each form a seal surrounding one of the one or more purge inlets.

Aspect 22. The method according to any of aspects 20-21, wherein each of the purge inlet interfaces are spaced apart from a surface of the pod door surrounding a corresponding one of the purge inlets when the pod dome is joined to the pod door.

Aspect 23. The method according to any of aspects 16-22, wherein the one or more channels are formed in a pod dome of the outer pod.

Aspect 24. The method according to any of aspects 16-23, wherein the one or more channels are formed in a pod door of the outer pod.

Aspect 25. A method, comprising purging an inner pod of a dual pod reticle container by directing purge gas from one or more inlets on the outer pod inlets to at least one filter provided on an inner pod by way of one or more channels formed in the outer pod.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A reticle pod, comprising:
an inner pod including a cover and a baseplate, wherein a plurality of filters are provided on the cover or the baseplate, the inner pod configured to accommodate a reticle; and
an outer pod configured to accommodate the inner pod, the outer pod including:
a pod door, the pod door including one or more purge inlets, and
a pod dome,
wherein at least one of the pod door and the pod dome including one or more channels each configured to direct flow from one of said at least one purge inlet to at least one of said plurality of filters, and
wherein the one or more channels are configured to direct flow such that a first pressure at a first filter of the plurality of filters is greater than a second pressure at a second filter of the plurality of filters.

2. The reticle pod of claim 1, wherein at least one of the one or more channels is a closed duct.

3. The reticle pod of claim 1, wherein the inner pod includes one or more deflectors positioned on an inner surface of the inner pod.

4. The reticle pod of claim 1, wherein the one or more deflectors are positioned between the first filter and the second filter.

5. The reticle pod of claim 1, wherein the one or more channels are formed in the pod dome.

6. The reticle pod of claim 5, wherein the pod dome includes a pod dome shell and one or more inserts joined to the pod dome shell, the one or more channels defined by the pod dome shell and the one or more inserts.

7. The reticle pod of claim 6, wherein the inserts are mechanically joined to the pod dome shell.

8. The reticle pod of claim 5, wherein the pod dome includes a purge inlet interface for each of the one or more purge inlets included in the pod door, the purge inlet interface configured to direct flow from one of the purge inlets to at least one of the one or more channels.

9. The reticle pod of claim 8, wherein each purge inlet interface includes a seal configured to contact the pod door surrounding the one of the purge inlets.

10. The reticle pod of claim 8, wherein each purge inlet interface is spaced apart from a surface of the pod door surrounding the one of the purge inlets when the pod dome is joined to the pod door.

11. The reticle pod of claim 8, wherein each purge inlet interface is configured to define a tortuous path between the one of the purge inlets and an internal space of the outer pod outside of the channels.

12. The reticle pod of claim 1, wherein the one or more channels are provided on the pod door.

13. The reticle pod of claim 12, wherein the one or more channels are at least partially defined by an insert attached to the pod door.

14. A reticle pod, comprising:
an inner pod including a cover and a baseplate, wherein at least one filter is provided on the cover or the baseplate, the inner pod configured to accommodate a reticle; and
an outer pod configured to accommodate the inner pod, the outer pod including:
a pod door, the pod door including one or more purge inlets, and
a pod dome, wherein the pod dome includes one or more channels, each configured to direct flow from one of said at least one purge inlet to one of said at least one filter, and
wherein the pod dome includes a purge inlet interface for each of the one or more purge inlets included in the pod door, the purge inlet interface configured to direct flow from one of the purge inlets to at least one of the one or more channels.

15. The reticle pod of claim 14, wherein at least one of the one or more channels is a closed duct.

16. The reticle pod of claim 14, wherein the pod dome includes a pod dome shell and one or more inserts joined to the pod dome shell, the one or more channels defined by the pod dome shell and the one or more inserts.

17. The reticle pod of claim 16, wherein the inserts are mechanically joined to the pod dome shell.

18. The reticle pod of claim 14, wherein each purge inlet interface includes a seal configured to contact the pod door surrounding the one of the purge inlets.

19. The reticle pod of claim 14, wherein each purge inlet interface is spaced apart from a surface of the pod door surrounding the one of the purge inlets when the pod dome is joined to the pod door.

20. The reticle pod of claim 14, wherein each purge inlet interface is configured to define a tortuous path between the one of the purge inlets and an internal space of the outer pod outside of the channels.

\* \* \* \* \*